United States Patent
Goel et al.

(10) Patent No.: US 9,652,371 B2
(45) Date of Patent: May 16, 2017

(54) LOOKAHEAD SCHEME FOR PRIORITIZED READS

(71) Applicant: Apple Inc., Cupertino, CA (US)

(72) Inventors: Rajat Goel, Saratoga, CA (US); Hari S. Kannan, Sunnyvale, CA (US); Khurram Z. Malik, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 59 days.

(21) Appl. No.: 14/624,621

(22) Filed: Feb. 18, 2015

(65) Prior Publication Data

US 2015/0161033 A1 Jun. 11, 2015

Related U.S. Application Data

(62) Division of application No. 13/282,873, filed on Oct. 27, 2011, now Pat. No. 9,009,369.

(51) Int. Cl.
| | | |
|---|---|---|
| G06F 13/16 | (2006.01) | |
| G06F 12/02 | (2006.01) | |
| G11C 8/06 | (2006.01) | |
| G11C 8/16 | (2006.01) | |
| G06F 5/16 | (2006.01) | |
| G06F 12/00 | (2006.01) | |

(52) U.S. Cl.
CPC ............ *G06F 12/0215* (2013.01); *G06F 5/16* (2013.01); *G06F 13/1673* (2013.01); *G11C 8/06* (2013.01); *G11C 8/16* (2013.01); *G06F 2212/301* (2013.01)

(58) Field of Classification Search
None
See application file for complete search history.

(56) References Cited

U.S. PATENT DOCUMENTS

| | | | |
|---|---|---|---|
| 5,822,776 A | 10/1998 | De Korte et al. | |
| 6,216,215 B1* | 4/2001 | Palanca | G06F 9/30043 712/23 |
| 6,704,820 B1 | 3/2004 | Walker et al. | |
| 6,795,889 B2 | 9/2004 | Berg et al. | |
| 7,080,170 B1* | 7/2006 | Zuraski, Jr. | G06F 5/10 710/52 |
| 7,085,274 B1* | 8/2006 | Rahim | H04L 12/5601 370/394 |
| 7,551,512 B2 | 6/2009 | Evans et al. | |
| 7,738,496 B1 | 6/2010 | Raza | |
| 2002/0037027 A1* | 3/2002 | Medlock | H04B 1/7117 375/147 |
| 2009/0187682 A1 | 7/2009 | Arndt | |
| 2012/0026367 A1 | 2/2012 | Noraz et al. | |
| 2012/0198267 A1* | 8/2012 | Das | G06F 13/1605 713/600 |

* cited by examiner

*Primary Examiner* — Scott Sun
(74) *Attorney, Agent, or Firm* — Meyertons, Hood, Kivlin, Kowert & Goetzel, P.C.; Erik A. Heter

(57) ABSTRACT

A circular queue implementing a scheme for prioritized reads is disclosed. In one embodiment, a circular queue (or buffer) includes a number of storage locations each configured to store a data value. A multiplexer tree is coupled between the storage locations and a read port. A priority circuit is configured to generate and provide selection signals to each multiplexer of the multiplexer tree, based on a priority scheme. Based on the states of the selection signals, one of the storage locations is coupled to the read port via the multiplexers of the multiplexer tree.

20 Claims, 6 Drawing Sheets

| Address | 0 | 1 | 2 | 3 | 4 | 5 | 6 | 7 |
|---|---|---|---|---|---|---|---|---|
| | | | Read Pointer → | | | | | |
| Unmasked Vector | 1 | 1 | 0 | 1 | 1 | 1 | 1 | 1 |
| Masked Vector | 0 | 0 | 0 | 1 | 1 | 1 | 1 | 1 |

Highest Priority = Address 3

Fig. 3A

| Address | 0 | 1 | 2 | 3 | 4 | 5 | 6 | 7 |
|---|---|---|---|---|---|---|---|---|
| | | | | | Read Pointer → | | | |
| Unmasked Vector | 1 | 1 | 0 | 0 | 0 | 0 | 0 | 0 |
| Masked Vector | 0 | 0 | 0 | 0 | 0 | 0 | 0 | 0 |

Highest Priority = Address 0

Fig. 3B

| Address | 0 | 1 | 2 | 3 | 4 | 5 | 6 | 7 |
|---|---|---|---|---|---|---|---|---|
| | | | Read Pointer → | | | | | |
| Unmasked Vector | 1 | 1 | 0 | 0 | 0 | 1 | 1 | 1 |
| Masked Vector | 0 | 0 | 0 | 0 | 0 | 1 | 1 | 1 |

Highest Priority = Address 5

Fig. 3C

| Address | 0 | 1 | 2 | 3 | 4 | 5 | 6 | 7 |
|---|---|---|---|---|---|---|---|---|
| | | | | | | Read Pointer → | | |
| Unmasked Vector | 0 | 1 | 1 | 0 | 0 | 0 | 0 | 0 |
| Masked Vector | 0 | 0 | 0 | 0 | 0 | 0 | 0 | 0 |

Highest Priority = Address 1

Fig. 3D

LOOKAHEAD SCHEME FOR PRIORITIZED READS

PRIORITY INFORMATION

This application is a divisional of U.S. patent application Ser. No. 13/282,873, filed Oct. 27, 2011, which is incorporated by reference herein in its entirety.

BACKGROUND

Technical Field

Embodiments described herein are related to the field of integrated circuits, and more particularly, to reading register files and other types of storage circuits.

Description of the Related Art

Many integrated circuits (ICs) include one or more on-chip memories. One type of memory implemented on certain types of ICs is known as a circular queue (also known as a circular buffer). A circular queue is a memory that is effectively connected end-to-end, with write and read pointers that advance as data is written and read, respectively. The write pointer may write (and overwrite) storage locations in a sequential fashion, writing to one location and then advancing to the next. Similarly, the read pointer may also read storage locations in a sequential fashion, reading one location and then advancing.

Circular queues have a large number of applications. For example, circular queues are widely used in multimedia applications that utilize streaming data. In processors, circular queues may be used to implement load/store units, reservation stations, schedulers and so on. In general, circular queues may be implemented in a wide variety of applications in which data is to be buffered and read out in a sequential manner.

SUMMARY

A circular queue implementing a scheme for prioritized reads is disclosed. In one embodiment, a circular queue (or buffer) includes a number of storage locations each configured to store a data value. A multiplexer tree is coupled between the storage locations and a read port. A priority circuit is configured to generate and provide selection signals to each multiplexer of the multiplexer tree, based on a priority scheme. Based on the states of the selection signals, one of the storage locations is coupled to the read port via the multiplexers of the multiplexer tree.

In one embodiment, each of the storage locations includes a valid bit. A read pointer is also associated with the circular queue, and advances from a lowest (beginning address) to a highest (ending) address before wrapping around and beginning advancement again at the lowest address. The priority circuit is configured to generate a first vector based on all the valid bits that are set. The priority circuit is further configured to generate a second vector including all the valid bits (set or reset) subsequent to a current address of the read pointer and ending with the highest address. If one or more valid bits of the second vector are set, then the priority circuit is configured to assign a highest priority to the storage location associated with the valid bit of the second vector that is closest to the current address of the read pointer. If none of the valid bits of the second vector are set, the priority circuit is configured to assign the highest priority to a storage location having an address closest to the lowest address for which its respective valid bit is set. The storage location that is assigned the highest priority is thus selected to be the storage location that is next to be read. The priority circuit is configured to generate selection signals to be provided to each of the multiplexers to coupled the selected storage location to the read port. Generally speaking, the priority circuit is configured to give a higher priority to storage locations having a set valid bit in the second vector. Furthermore, the priority scheme may result in the oldest valid data in the queue being read.

BRIEF DESCRIPTION OF THE DRAWINGS

The following detailed description makes reference to the accompanying drawings, which are now briefly described.

FIGS. 3A-3D are examples illustrating a priority scheme utilized by one embodiment of a priority circuit.

Figure 1:
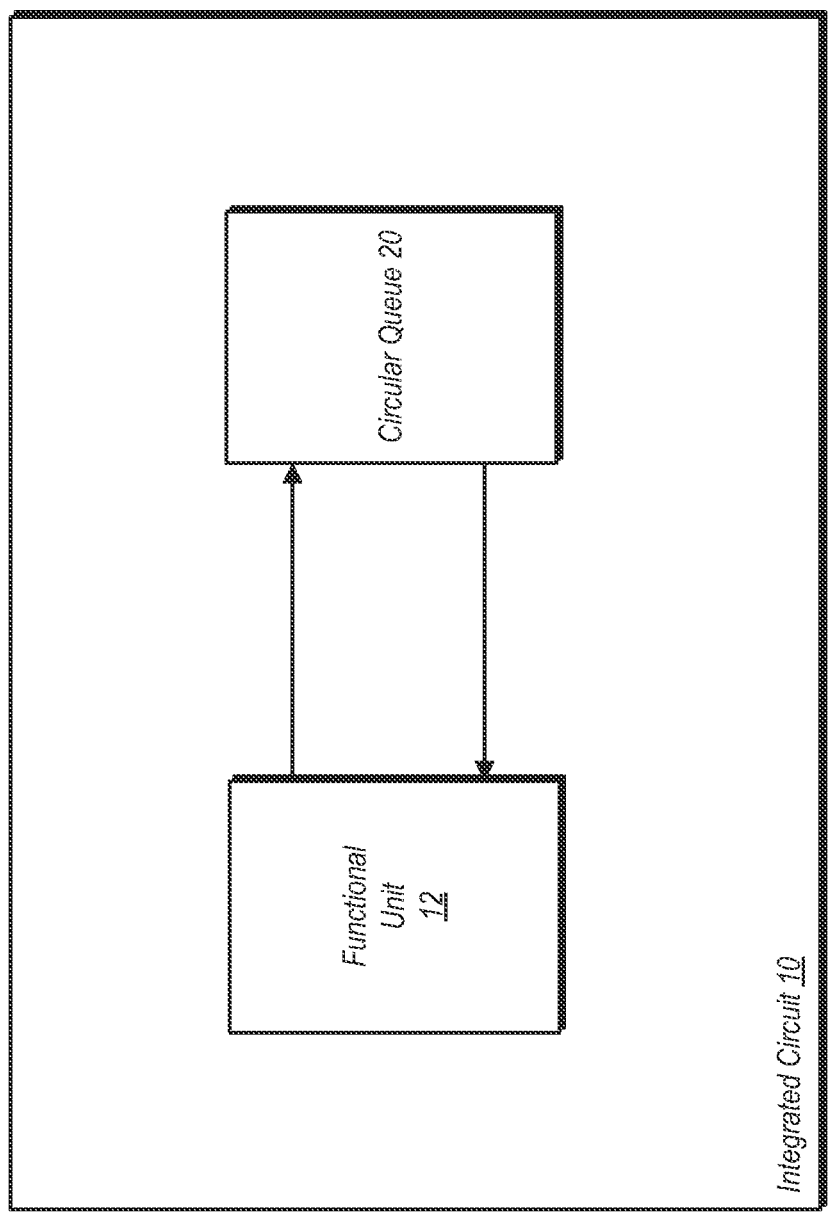
FIG. 1 is a block diagram of one embodiment of an integrated circuit (IC) having a circular queue.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit and Circular Queue:

Turning now to FIG. 1, a block diagram of one embodiment of an integrated circuit (IC) is shown. In the embodiment shown, IC 10 includes a functional unit 12 and a circular queue 20. Although not explicitly shown, IC 10 may include one or more additional functional units 12, as well as additional circular queues 20 as well as other types of circuitry. The simplified version of IC 10 is shown here to illustrate the relation of a circular queue to a functional unit in one embodiment. IC 10 may be one of many different types of IC's. For example, IC 10 may be a system-on-a-chip (SOC), a processor, a digital signal processor, a graphics processor, and so on.

Functional unit 12 may be one of many different types of functional units of an IC. For example, functional unit 12 may be an execution unit, a processor core including an execution unit, a digital signal processing unit, a graphics processing unit, and so forth. In general, functional unit 12 may be any type of circuitry that may utilize a circular queue. The exemplary functional unit types and IC types discussed herein are not intended to be limiting, and other types of IC's and functional units not explicitly discussed herein are also possible and contemplated.

Circular queue 20 in the embodiment shown is a queue that may provide temporary storage for functional unit 12. In this particular example, functional unit 12 may both write to and read from circular queue 20. However, embodiments implementing different functional units that write to and/or read from circular queue 20 are also possible and contemplated. Circular queue 20 may include a number of storage locations that store data to be used by functional unit 12. The data may be read in a circular manner, with a read pointer advancing from one address to the next and reading data stored in the various location as it advances. It is noted however that reading from some locations may be skipped if those locations are not storing valid data. Data may also be written to storage locations in a circular queue 20 in a similar manner, with a write pointer advancing from one storage location to subsequent storage locations and writing data therein. Circular queue 20 may include a beginning (or lowest) address and an ending (or highest) address. Both the read and write pointers may advance in the direction from the lowest address to the highest address before wrapping around and advancing again from the lowest address onward. Furthermore, the rate of advancement of the read and write pointers may vary during operation of circular queue 20. For example, advancement of the write pointer may be stalled to prevent overwriting of valid data that has not yet been read. In another example, the read pointer may advance past one or more storage locations that are not storing valid data to read the next storage location having valid data stored therein.

Circular queue 20 may be used in one of a number of different applications. For example, circular queue 20 may be a reservation station in a processor that utilizes register renaming. Another example of an application, circular queue 20 may be a load/store unit in a processor that executes load and store instructions. Schedulers that schedule instructions to be issued and executed in a processor may also utilize a circular queue. In general, these examples are not intended to be limiting, and thus a circular queue as disclosed in herein may be utilized in any type of application in which the structure and operation of a circular queue is desirable.

Figure 2A:
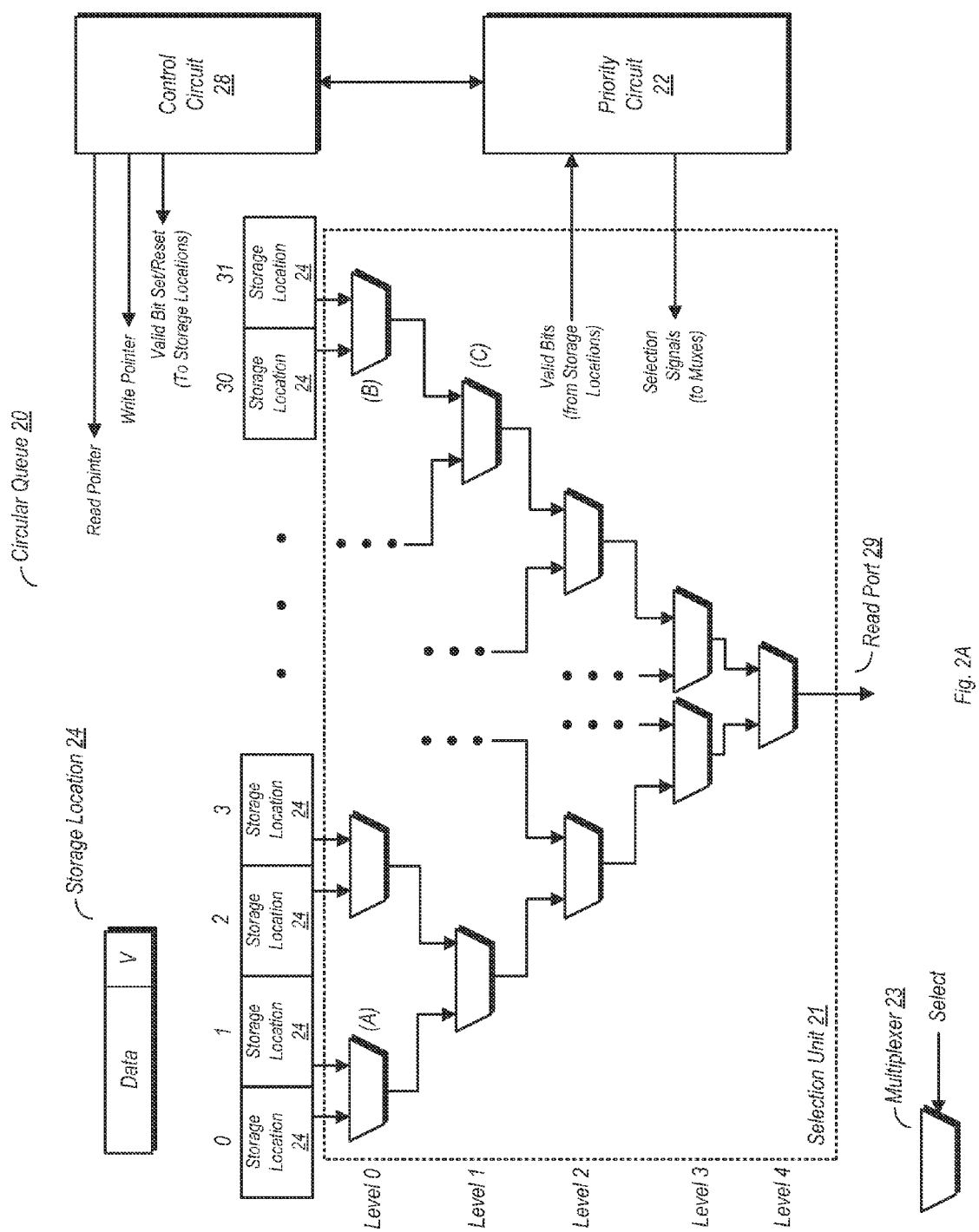
FIG. 2A is a diagram illustrating one embodiment of a circular queue including storage locations, a priority circuit, and a multiplexer tree.

FIG. 2A is a diagram illustrating additional details for one embodiment of a circular queue 20. In the embodiment shown, circular queue 20 includes a number of storage locations 24. In this example, circular queue includes 32 storage locations arranged from address 0 to address 31. Read and write pointers generated by control circuit 28 may advance from address 0 to address 31 and subsequently return to address 0 before advancing again. Although not explicitly shown, circular queue 20 may include a write port through which data is written to the storage location 24 indicated by the write pointer.

Each storage location 24 in the embodiment shown includes a portion for storing data ('Data') and a portion for storing a valid bit ('V'). Other portions for storing information (e.g., tags) may also be included in other embodiments, and the exact format of information stored in a storage location may vary from one embodiment to the next. The data may be virtually any kind of information including (but not limited to) instructions, operands, address data, or any other type of data that may be stored.

The valid bit for a given storage location 24 may be set (e.g., written as a logic 1) when data is written thereto. The valid bit for a given storage location 24 may be reset (e.g., written as a logic 0) when it has been read. In various embodiments, additional situations may cause a valid bit for a given storage location 24 to be reset even though the corresponding data has not yet been read. For example, when used in conjunction with a processor configured for speculative execution, a branch misprediction may cause at least some storage locations to be invalidated (with a corresponding reset of the valid bit) without having been read. Another example in which one or more locations of stored data may be invalidated without having been read is an exception (e.g., due to an interrupt). Specific causes of data being invalidated without having been read may depend on the application of circular queue 20, and are thus not limited to the examples given here. In some instances, all data stored in circular queue 20 may be invalidated responsive to some event occurring. Furthermore, embodiments in which all data stored in circular queue 20 is valid at a given moment are also possible and contemplated.

In the embodiment shown, circular queue 20 includes a selection unit 21 having a number of hierarchically arranged multiplexer 23. The number of multiplexers 23 in a given embodiment (as well as the number of levels) may depend on the number of storage locations 24. Each multiplexer 23 of a top level of the hierarchy includes inputs coupled to receive data from storage locations 24. For example, the multiplexer 23 furthest to the left on the top row in the illustrated embodiment is coupled to receive data from storage locations 24 at addresses 0 (a first input) and address 1 (a second input). It is noted that the inputs may be parallel connections to the storage locations 24, allowing data to be read therefrom in parallel. However, embodiments in which data is serially read are also possible and contemplated.

Each of multiplexers 23 is coupled to receive a corresponding selection signal ('Select'). A selection signal may be unique for each multiplexer 23, and may cause that multiplexer to select one of its two inputs to be provided as an output. The selection signals may be generated by priority circuit 22. In the embodiment shown, priority circuit 22 may resolve the read priority of the storage locations 24. More particular, priority circuit 22 may determine which storage location 24 has the highest read priority and thus should be the next one to be read. In the embodiment shown, priority circuit 22 is coupled to receive corresponding valid bits from each of the storage locations 24. In addition, control circuit 28 in the embodiment shown is configured to provide information indicating the current location of the read pointer to priority circuit 22. As will be discussed in further detail below, priority circuit 22 may determine which storage location 24 has the highest read priority based on the respective states of the valid bits and the position of the read pointer. Responsive to determining the storage location associated with the highest priority, priority circuit 22 may generate selection signals for each of the multiplexers 23 of selection unit 21. Responsive to the selection signals, multiplexers 23 may couple the selected storage location 24 to the output of a final multiplexer 23 that serves as read port 29.

Utilizing priority circuit 22 in the illustrated embodiment may allow for some logic to be eliminated relative to embodiments in which the priority logic is implemented within the multiplexer tree of selection unit 21. Such prior art embodiments may utilize pickers, and may include additional levels of multiplexers beyond that which is shown in FIG. 2A. For example, in some prior art embodiments, two read ports are provided with the final result being multiplexed between them. In the embodiment of FIG. 2A, only a single read port is included, and at least one level of multiplexers is eliminated relative to an embodiment having the same number of storage locations 24 that otherwise utilizes two read ports.

Figure 2B:
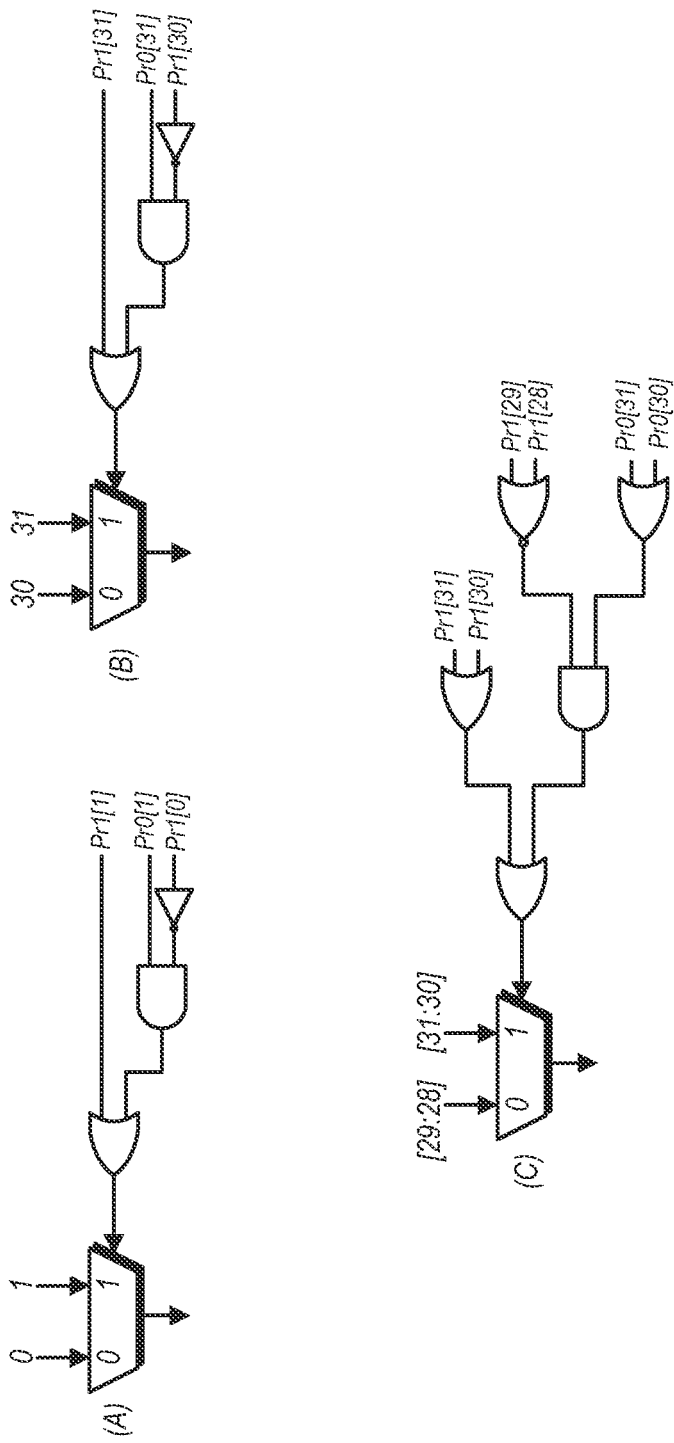
FIG. 2B is a diagram illustrating portions of the priority encoding logic in a priority circuit of one embodiment of a circular queue.

FIG. 2B illustrates some of the priority encoding logic present in one embodiment of a priority circuit 22. In FIG. 2A, three separate instances of a multiplexer 23 are respectively labeled (A), (B), and (C). In FIG. 2B, the logic for generating the selection signals for each of these exemplary multiplexers 23 is illustrated. In the labeling of particular logic inputs, an input labeled with PR1 indicates a bit from a masked vector, while an input labeled with PR0 indicates a bit from an unmasked vector. Each of the bits corresponds to a storage location 24 in circular queue 20. A set bit (e.g., a logic 1) corresponding to a particular storage location 24 indicates a set valid bit in that location. A reset bit (e.g., a logic 0) corresponding to a particular storage location 24 indicates a reset valid bit in that location. Masked and unmasked vectors will be discussed in further detail below in reference to FIGS. 3A-3D. For the purposes of this discussion, it is noted that bits that are set (e.g., logic 1) in the masked vector indicate a higher priority over bits that are set only in the unmasked vector.

In the illustrated example, multiplexer 23(A) and 23(B) are level 0 multiplexers, as shown in FIG. 2A. For multiplexer 23(A), the select signal is asserted as a logic 1 to select address 1 of the queue if at least one of two conditions is true. The first condition is that the masked vector includes a set bit at position 1. A second condition is that the unmasked vector includes a set bit at position 1 and a reset (e.g., logic 0) bit at position 0. If either of these conditions is true, the select signal is input into multiplexer 23(A) as a logic 1, thereby selecting address 1. If neither one of these conditions is true, the select signal is input into multiplexer 23(A) as a logic 0, thereby selecting address 0.

A similar situation exists for multiplexer 23(B). More particularly, the select signal input into multiplexer 23 (B0 is driven to a logic 1 if at least one of two conditions is true. The first condition is that the masked vector includes a set bit at position 31 (which corresponds to the storage location 24 at address 31). The second condition is that the unmasked vector includes a set bit at position 31 or the masked vector includes a reset bit at position 30 (which corresponds to the storage location at address 30). If one or both of these conditions is true, the corresponding select signal is input into multiplexer 23(B) as a logic 1, thereby selecting the storage location at address 31 of the queue. If neither of these conditions is true, the corresponding select signal is input into multiplexer 23(B) as a logic 0, thereby selecting the storage location at address 30 of the queue.

The logic equations for each of the multiplexers 23 of level 0 are as follows:

(Pr1[1] OR (~Pr1[0] AND Pr0[1]))

(Pr1[3] OR (~Pr1[2] AND Pr0[3])), (Pr1[5] OR (~Pr1[4] AND Pr0[5])), (Pr1[7] OR (~Pr1[6] AND Pr0[7])), (Pr1[9] OR (~Pr1[8] AND Pr0[9])), (Pr1[11] OR (~Pr1[10] AND Pr0[11])), (Pr1[13] OR (~Pr1[12] AND Pr0[13])), (Pr1[15] OR (~Pr1[14] AND Pr0[15])), (Pr1[17] OR (~Pr1[16] AND Pr0[17])), (Pr1[19] OR (~Pr1[18] AND Pr0[19])), (Pr1[21] OR (~Pr1[20] AND Pr0[21])), (Pr1[23] OR (~Pr1[22] AND Pr0[23])), (Pr1[25] OR (~Pr1[24] AND Pr0[25])), (Pr1[27] OR (~Pr1[26] AND Pr0[27])), (Pr1[29] OR (~Pr1[28] AND Pr0[29])), (Pr1[31] OR (~Pr1[30] AND Pr0[31])).

Multiplexer 23(C) in the example shown is a level 1 multiplexer, and is thus configured to receive as inputs the output from two different ones of the level 0 multiplexers. In this case, multiplexer 23(C) is coupled to receive as a first input the output from multiplexer 23(B), which is configured to select one of addresses 30 and 31 of the queue. The other input to multiplexer 23(C) is another multiplexer 23 (not shown) configured to select one of addresses 28 and 29 from the queue. First condition that may cause the corresponding select signal to be input into multiplexer 23(C) as a logic 1 is a set bit in one or both of positions 30 and 31 of the masked vector. A second condition that may cause the corresponding select signal to be input into multiplexer 23(C) occurs with the ANDing of two additional conditions producing a logic 1. A first of the additional conditions is true if neither of positions 28 or 29 includes a set bit in the masked vector. A second of the additional conditions is true if a bit is set at either or both of positions 30 and 31 of the unmasked vector. If both of the additional conditions are true, then the corresponding select signal is input into multiplexer 23(C) as a logic 1, thereby selecting the output of the multiplexer 23 associated with addresses 30 and 31. If neither of the first or second conditions described in this paragraph are true, the corresponding select signal is input into multiplexer 23(C) as a logic 0, thereby selecting the output of the multiplexer associated with addresses 28 and 29.

Logic equations similar to those presented above may be used to describe the conditions for generating the corresponding select signals of multiplexers 23 in level 1. Similarly, additional logic equations may be used to describe the generation of select signals for each multiplexer 23 in levels 2, 3, and 4. Priority circuit 22 of FIG. 2A may include logic coupled to receive as inputs the various bits of the masked and unmasked vectors. The logic of priority circuit 22 may generate the select signals for each of the multiplexers 23 in order to select one of the storage locations 24 during a read operation. More particularly, the logic of priority circuit 22 may be configured to select a storage location 24 having the highest read priority for a given read cycle.

Returning now to FIG. 2A, circular queue 20 in the embodiment shown also includes a control circuit 28. The respective positions of the read and write pointers may be determined by control circuit 28. In some cases, the read and write pointers may advance from one storage location 24 to the next for each cycle. However, in some situations, the rate of advancement of the pointers may change. For example, the read pointer may advance by two or more storage locations 24 if the next storage location is not storing valid data. In another example, the write pointer may be stalled if the read pointer is at the next storage location 24 and that location is storing valid data. In some cases, both the read and write pointers may be temporarily halted. For example, a flush of circular queue 20 resulting from a branch misprediction could result in both pointers temporarily stopped. Thereafter, the write pointer may be returned to the storage location 24 at address 0 when new data is ready to be written, and may begin advancing therefrom. The read pointer may begin advancing thereafter when at least one subsequent storage location 24 is storing valid data.

Control circuit 28 in the embodiment shown is also configured to set and reset the valid bits for each of storage locations 24. Although not explicitly shown, control circuit 28 may include one or more interfaces to external components that may provide information indicating when data stored in one or more of storage locations 24 is to be invalidated. Control circuit 28 may also cause a valid bit of a storage location 24 to be reset when its corresponding data is read in some embodiments. However, it is noted that embodiments are possible and contemplated in which a valid bit is not necessarily reset after reading the data stored in the corresponding location. A valid bit for a given storage location 24 may be set by control circuit 28 responsive to a successful write of new data.

It is noted that while priority circuit 22 and control circuit 28 are shown as separate units in the illustrated embodiment, other embodiments are possible and contemplated in which these circuits are consolidated into a single unit. In general, control circuit 28 and priority circuit 22 and the functions provided by each may be arranged and implemented in any suitable manner.

Priority Scheme Examples and Method Flow:

FIGS. 3A-3D are illustrated examples of a priority scheme implemented by one embodiment of priority circuit 22 of FIG. 2. It is noted that other priority schemes are possible and contemplated.

The priority scheme implemented by one embodiment of priority circuit 22 contemplates the generation of two vectors, referred to here as an unmasked vector and a masked vector. The unmasked vector may include the valid bits for all storage locations of the circular queue. The masked vector may set (or eliminate) all valid bits that are not between the read pointer and the highest address of the circular queue. The examples of FIGS. 3A-3D are directed to an embodiment having eight storage locations, although the priority scheme may be applied to circular queues having any practical number of storage locations. In the example of FIG. 3A, the unmasked vector includes storage locations at addresses 0, 1, and 2 (the final address being the current location of the read pointer). The masked vector in the same example includes storage locations at addresses 3-7. In the masked vector, locations 0, 1, and 2 are reset to 0 in the illustrated example, although these positions may be eliminated entirely.

In the priority scheme illustrated here, storage locations associated with valid bits in the masked vector are given higher priority over those associated with the masked bits. Thus, a storage location having a set valid bit to the right of the read pointer (as shown in FIGS. 3A-3D) is given priority over those at or to the left of the read pointer. The priority scheme may thus give the highest priority to the storage location having a set valid bit and being closest to the read pointer in the masked vector. If no valid bits in the masked vector are set (indicating no valid data at corresponding storage locations), then the storage location having a set valid bit that is closest to the beginning address (e.g., address 0 in the illustrated examples) is given priority. If no valid bits are set in either of the vectors, then no read occurs during that particular cycle. Using this priority scheme, the oldest data stored in the circular queue may be given the highest read priority.

It is noted that the arrangement of the vectors shown here is exemplary, and other arrangements may be used to implement the illustrated priority scheme. For example, both the masked and unmasked vectors may be compressed in some embodiments to include only set valid bits. Alternatively, two vectors may be generated, the first being to the right of the read pointer and a second being at or to the left of the read pointer.

In the example of FIG. 3A, the valid bits are set for every storage location of the corresponding circular queue, while the read pointer is at address 2. Thus, the unmasked vector includes set valid bits (e.g., logic 1's in this example) for each storage location. The masked vector may be generated by resetting (e.g., changing to logic 0) the valid bits for storage locations at addresses 0, 1, and 2, since these addresses are not between the read pointer and the final address. Accordingly, the remaining set valid bits in the masked vector correspond to positions that are between the read pointer and the final address. In this example, address 3 is given the highest priority, since it is a set valid bit in the masked vector that is closest to the read pointer. A priority circuit may generate selection signals corresponding to address 3 and the read pointer may be advanced to the corresponding storage location for the next read cycle.

In the example of FIG. 3B, valid bits are set only for storage locations at addresses 0 and 1, while the read pointer is at the address of storage location 4. Thus, there are no set valid bits in the masked vector. Since the valid bits corresponding to addresses 0 and 1 are the only set valid bits, address 0 is given the highest priority, as its corresponding storage location is storing the oldest valid data in the circular queue. The priority circuit may generate selection signals in order to select the storage location corresponding address 0 for the next read cycle. The read pointer may also be advanced to address 0 for the next cycle.

In FIG. 3C, valid bits are set for address 0, 1, and 5-7, as shown in the unmasked vector. The set valid bits for addresses 0 and 1 are reset to logic 0's in the masked vector. The read pointer in this example is at address 2. Since there are valid bits set in the masked vector, the storage location having the highest priority is chosen based on one of its corresponding valid bits. In this example, the address closest to the read pointer with a corresponding valid bit set is address 5. Accordingly, the storage location address 5 is designated as having the highest read priority for the next cycle.

In the final example illustrated in FIG. 3D, addresses 1 and 2 have valid bits set, while the valid bits are reset for the remaining addresses. Furthermore, the read pointer is at address 5 in this example. Accordingly, there are two set valid bits in the unmasked vector, and no set valid bits in the masked vector. Since there are not set valid bits in the masked vector, and since address 1 is assigned the highest read priority since it is the address closest to address 0 having a set valid bit. Accordingly, the read pointer is advanced to address 1 for a read on the next cycle.

Figure 4:
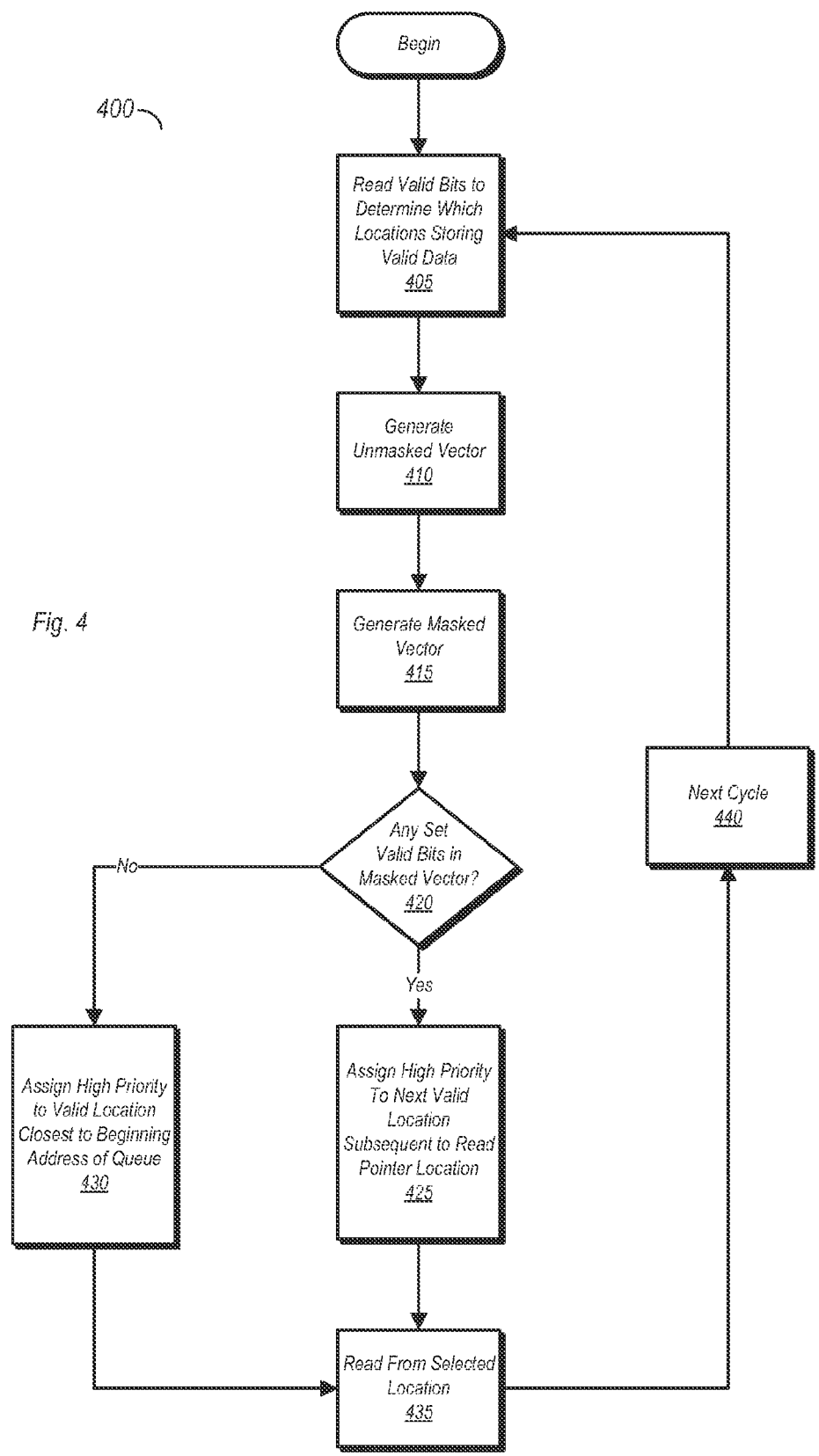
FIG. 4 is a flow diagram illustrating one embodiment of a method for selecting a highest priority read.

FIG. 4 is a flow diagram illustrating one embodiment of a method for selecting a highest priority read. Method 400 may be used with the various embodiments of the hardware described with reference to FIG. 2, or may be implemented using other embodiments not explicitly disclosed herein.

Method 400 begins with the reading of valid bits for each storage location of a circular queue in order to determine which locations are storing valid data (block 405). A valid bit may be in a set state (e.g., logic 1) to indicate that valid data is stored in the corresponding storage location. If the valid bit is in a reset state (e.g., logic 0) to indicate that the corresponding storage location is not storing valid data.

Method 400 then continues with the generation of an unmasked vector (block 410) and a masked vector (block 415). In one embodiment, the unmasked vector includes all valid bits, set and reset, for the entire group of storage locations in the circular queue. The masked vector may include all valid bits that are between the location of the read pointer and the last (e.g., highest) address of the circular queue, with valid bits being masked out (e.g., changed to a reset state) for locations between the first (e.g., lowest) address up to and including the read pointer address. Other embodiments are possible and contemplated in which the masked and unmasked vectors are structured differently. In general, the masked vector may be used to indicate which (if any) storage locations between the current read pointer position and the end address have a valid bit set. Storage locations corresponding to a set valid bit in the masked vector may be given a higher read priority than those that are present only in the unmasked vector.

After the unmasked and masked vectors have been generated, a priority encoder (e.g., priority circuit 22 of FIG. 2) may use the vectors to determine which storage location has the highest read priority. Moreover, the vectors may be used to determine which storage location is storing the oldest valid data, with the highest read priority is assigned to this location. If any valid bits in the masked vector are set (block 420, yes), then the highest priority is assigned to the next location subsequent to the read pointer that has a set valid bit (block 425). That is, the location associated with the set valid bit in the masked vector that has an address closest to the read pointer is selected to have the highest read priority. If there are no set valid bits in the masked vector (block 420, no), then the highest priority is assigned to the location associated with the valid bit closest to the beginning address of the circular queue (block 430). In either case, the storage location to which the highest priority is assigned may be that which is currently storing the oldest valid data in the queue.

After determining the highest priority, data may be read from the selected location (block 435). The method may then advance to the next cycle (block 440), and repeat itself beginning with block 405.

Figure 5:
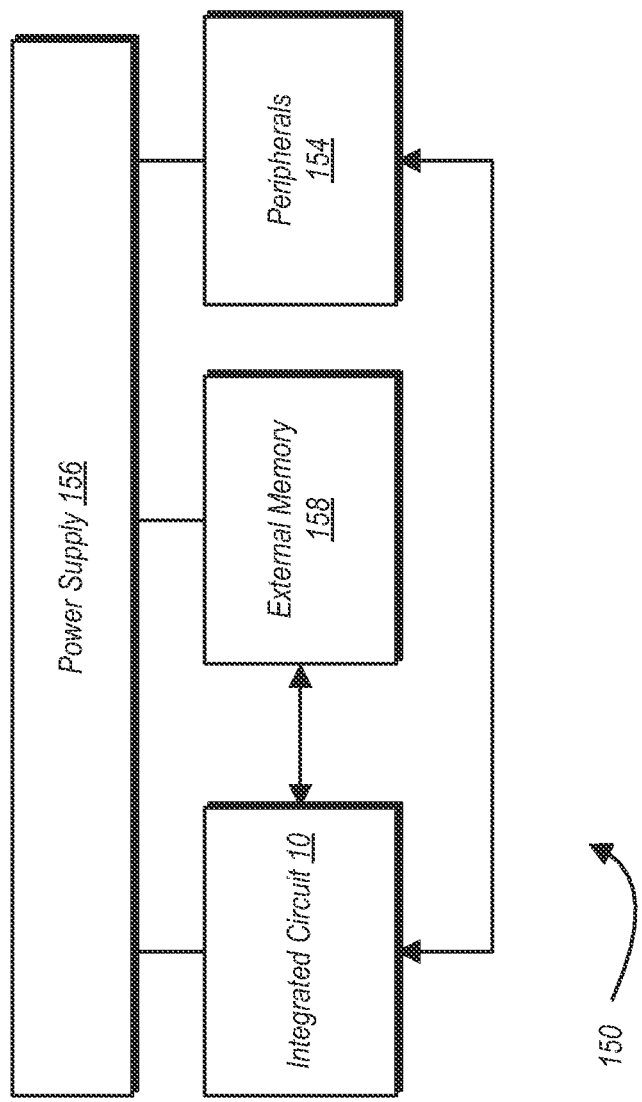
FIG. 5 is a block diagram of one embodiment of a system.

Exemplary System:

Turning next to FIG. 5, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
   determining which of a plurality of storage locations of a circular buffer are storing valid data, as indicated by valid bits, wherein storage locations of the plurality of storage locations are arranged from a beginning address to an end address, and wherein the circular buffer includes a read pointer;
   determining which, if any, of a subset of the plurality of storage locations are storing valid data, wherein the subset excludes storage locations associated with addresses between the beginning address up to a current address at which the read pointer is located;
   selecting a first storage location of the subset of storage locations if one or more storage locations of the subset are storing valid data; and
   selecting a storage location closest to the beginning address if none of the storage locations of the subset are storing valid data.

2. The method as recited in claim 1, wherein the first storage location is a storage location having an address closest to the read pointer and between the read pointer and the end address.

3. The method as recited in claim 2 wherein the read pointer is configured to advance from the beginning address to the end address, and subsequently return to the beginning address.

4. The method as recited in claim 1, further comprising:
   generating a plurality of control signals;
   providing the plurality of control signals to a selection unit having a plurality of multiplexers; and coupling a selected one of the plurality of storage locations to a read port via the plurality of multiplexers responsive to the plurality of control signals.

5. A method comprising:
reading valid bits for each of a plurality of storage locations, wherein each valid bit indicates, when set, that its corresponding storage location is storing data that is ready to be read; wherein the plurality of storage locations are arranged as a circular buffer having corresponding addresses ranging from a first address to a last address;
generating a first vector of valid bits, wherein the first vector comprises each valid bit that is set within the plurality of storage locations;
generating a second vector of valid bits, wherein the second vector comprises valid bits associated with storage locations ranging between a current address of a read pointer and the last address and excludes valid bits between the first address of the circular buffer up to and including the current address of the read pointer; and
selecting a storage location corresponding to a valid bit of the second vector if at least one valid bit of the second vector is set.

6. The method as recited in claim 5, further comprising:
selecting a storage location closest to the first address corresponding to a set valid bit of the first vector if no valid bits of the second vector are set.

7. The method as recited in claim 6, further comprising reading data from the selected storage location.

8. The method as recited in claim 5, further comprising:
generating a plurality of selection signals based on said selecting;
providing the plurality of selection signals to corresponding ones of a plurality of multiplexers, wherein the plurality of storage locations is coupled to the plurality of multiplexers; and
providing data from the selected storage location to a read port via the plurality of multiplexers responsive to said providing the plurality of selection signals.

9. The method as recited in claim 1, further comprising:
a control circuit advancing the read pointer one or more locations; and
the control circuit controlling a position of a write pointer.

10. The method as recited in claim 9, further comprising the control circuit setting a valid bit in a given one of the plurality of storage locations responsive to data being written to that one of the plurality of storage locations.

11. The method as recited in claim 10, further comprising the control circuit resetting a valid bit in the given one of the plurality of storage locations responsive to data being read from that one of the plurality of storage locations.

12. The method as recited in claim 10, further comprising the control circuit resetting the valid bit in one or more of the plurality of storage locations that have not been read responsive to an indication that data stored therein is no longer valid.

13. The method as recited in claim 5, further comprising:
a control circuit advancing the read pointer one or more locations; and
the control circuit controlling a position of a write pointer.

14. The method as recited in claim 13, further comprising the control circuit setting a valid bit in a given one of the plurality of storage locations responsive to data being written to that one of the plurality of storage locations.

15. The method as recited in claim 14, further comprising the control circuit resetting a valid bit in the given one of the plurality of storage locations responsive to data being read from that one of the plurality of storage locations.

16. The method as recited in claim 14, further comprising the control circuit resetting the valid bit in one or more of the plurality of storage locations that have not been read responsive to an indication that data stored therein is no longer valid.

17. An apparatus comprising:
a circular buffer having a plurality of storage locations arranged from a beginning address to an end address, wherein each of the storage locations includes a valid bit indicating its corresponding storage location is storing valid data;
a control circuit configured to cause a read pointer to point to an address of a selected one of the plurality of storage locations; and
a priority circuit configured to determine which, if any, of a subset of the plurality of storage locations are storing valid data, wherein the subset excludes storage locations associated with addresses between the beginning address up to a current address at which the read pointer is located;
wherein the priority circuit is configured to cause selection of a first storage location of the subset of storage locations if one or more storage locations of the subset are storing valid data, and further configured to cause selection of a storage location closest to the beginning address if none of the storage locations of the subset are storing valid data.

18. The apparatus as recited in claim 17, wherein the first storage location is a storage location having an address closest to the read pointer and between the read pointer and the end address.

19. The apparatus as recited in claim 18, wherein the control circuit is configured to cause the read pointer to advance from the beginning address to the end address, and subsequently return to the beginning address.

20. The apparatus as recited in claim 17, further comprising selection unit having a plurality of multiplexers, wherein the priority circuit is configured to generate and provide a plurality of control signals to the selection unit in order to cause coupling of a selected one of the plurality of storage locations to a read port via the plurality of multiplexers.

* * * * *